(12) United States Patent
Mohajerzadeh et al.

(10) Patent No.: US 8,767,184 B2
(45) Date of Patent: Jul. 1, 2014

(54) OPTICAL NANOLITHOGRAPHY SYSTEM AND METHOD USING A TILTING TRANSPARENT MEDIUM

(76) Inventors: Seyed Shamsoddin Mohajerzadeh, Tehran (IR); Javad Koohsorkhi, Tehran (IR); Zahra Kolahdouz Esfahani, Tehran (IR)

(*) Notice: Subject to any disclaimer, the term of this patent is extended or adjusted under 35 U.S.C. 154(b) by 603 days.

(21) Appl. No.: 13/046,800

(22) Filed: Mar. 14, 2011

(65) Prior Publication Data

US 2011/0164231 A1 Jul. 7, 2011

(51) Int. Cl.
*G03B 27/32* (2006.01)
(52) U.S. Cl.
USPC .......................................................... 355/77
(58) Field of Classification Search
CPC .................... G03F 7/70258; G03F 7/70466
See application file for complete search history.

(56) References Cited

U.S. PATENT DOCUMENTS

2001/0052966 A1* 12/2001 Fujitsuka et al. ............... 355/53
2004/0135982 A1* 7/2004 Kluter ............................ 355/67

* cited by examiner

*Primary Examiner* — Peter B Kim
*Assistant Examiner* — Michelle Iacoletti

(57) ABSTRACT

An optical nanolithography system and a method for optical nanolithography using a tilting transparent medium are disclosed. Initially, a pattern is exposed on a substrate at a first location by sending electromagnetic energy through the tilting transparent medium at a first angle. Then, the angle of the tilting transparent medium is changed to a second angle that is different from the first angle. Next, the pattern is exposed on the substrate at a second location by sending electromagnetic energy through the tilting transparent medium at the second angle. The second location is different from and partially overlaps with the first location. Then, the substrate is developed so that overlapping regions of the substrate exposed by the pattern at the first location and at the second location are developed differently from non-overlapping regions of the substrate exposed by the pattern only at the first location or at the second location.

16 Claims, 13 Drawing Sheets

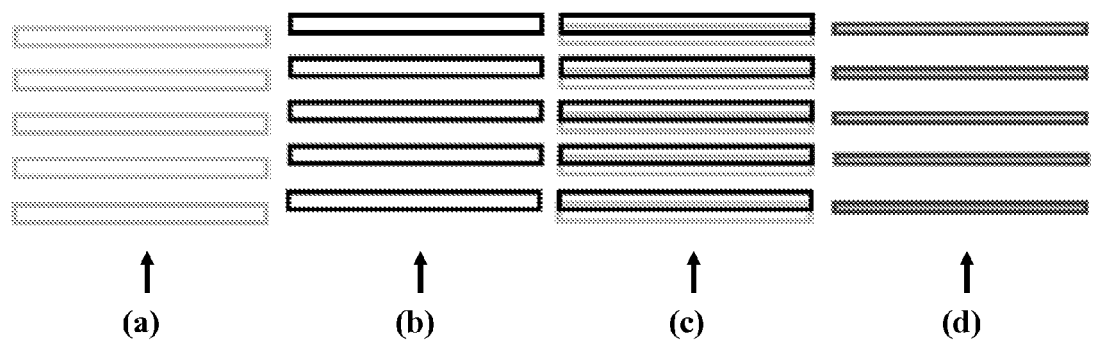
Figs. 5a-d

602

604

702　　　　　　　　702

708     708

802

OPTICAL NANOLITHOGRAPHY SYSTEM AND METHOD USING A TILTING TRANSPARENT MEDIUM

SPONSORSHIP STATEMENT

This application has been sponsored by the Iranian Nanotechnology Initiative Council, which does not have any rights in this application, and the Thin Film and Nanoelectronics Laboratory of the University of Tehran.

TECHNICAL FIELD

This application generally relates to lithography, and more particularly relates to an optical nanolithography system and method using a tilting transparent medium.

BACKGROUND

Optical lithography, i.e., photolithography, has enabled the exponential growth of the semiconductor industry in recent years. The increased resolution of features on integrated circuits has partly resulted from the increase in the numerical apertures of the lenses of optical lithography systems and the decrease of the exposure light wavelengths of the systems. Today, many optical lithography advances, such as phase-shift photo masks, multi-step patterning, new laser and x-ray sources, and Langmuir-Blodgett films, have allowed for further improvements in feature resolution.

Projection exposure systems developed during the late 1980's were a turning point for integrated circuit fabrication. In such systems, a pattern defined by a mask was projected by an optical system onto a wafer and the mask was typically the same size as the desired pattern. Due to limitations in the complexity of these systems, only part of the pattern was exposed on the wafer at any one time and, therefore, such systems were limited to resolutions between 0.7 µm and 3 µm.

As a result, in the early 1990s, step-and-repeat exposure systems were introduced. The masks of these systems only contained the pattern of a few dies instead of a complete wafer and allowed for the masks to be magnified by a factor of four relative to the pattern formed on the wafer. As such, these systems were used for lithography resolutions between 0.25 µm and 0.7 µm.

In the late 1990s, another evolution in optical lithography was the transition to step-and-scan exposure systems. These systems moved the reticle stage and wafer stage in directions normal to one another during exposure and projected an image onto a wafer through a single slit. These systems enabled higher resolutions with better control. Step-and-scan systems are currently being used for the manufacturing of integrated circuits in the 32 nm to 45 nm technology node.

For scaling beyond the 32 nm technology node, multiple-patterning lithography has been developed. Multiple-patterning lithography can be implemented with different manufacturing processes, such as litho-etch-litho-etch requiring two etching steps, litho-litho-etch, and spacer double-patterning. As such, multiple-patterning lithography requires two or more masks individually developed on the wafer and, therefore, mask production for these systems adds considerable expense to the production of integrated circuits.

Therefore, a new, more cost effective system for increasing lithography resolution is needed.

SUMMARY

A method for optical nanolithography using a tilting transparent medium is disclosed. Initially, a pattern is exposed on a substrate at a first location by sending electromagnetic energy through the tilting transparent medium at a first angle. Then, the angle of the tilting transparent medium is changed to a second angle that is different from the first angle. Next, the pattern is exposed on the substrate at a second location by sending electromagnetic energy through the tilting transparent medium at the second angle. The second location is different from and partially overlaps with the first location. Then, the substrate is developed so that overlapping regions of the substrate exposed by the pattern at the first location and at the second location are developed differently from non-overlapping regions of the substrate exposed by the pattern only at the first location or at the second location.

In some embodiments, the location of the substrate in an X-Y plane can be shifted, such that the pattern can be exposed on the shifted substrate at the second location by sending electromagnetic energy through the tilting transparent medium at the second angle. The electromagnetic energy can pass through a mask defining the pattern and then through the tilting transparent medium at the first angle to expose the pattern on the substrate at the first location.

In some embodiments, the electromagnetic energy can be light. The light can be emitted from a light-emitting diode and/or a semiconductor laser diode. The pattern can be a geometric pattern, or a linear array of holes.

In some embodiments, one end of a tilting transparent medium holder can be vertically displaced to change the angle of the tilting transparent medium to the second angle. One end of the tilting transparent medium holder can be displaced by modulating a micrometer connected to the one end of the tilting transparent medium holder by, for example, a motor. The tilting transparent medium can also be rotated about an axis of rotation.

In some embodiments, the substrate can be a silicon wafer coated with a photoresist. The silicon wafer can be developed so that overlapping regions of the silicon wafer exposed by the pattern at the first location and the second location are relatively more soluble to photoresist developer than the non-overlapping regions of the silicon wafer exposed by the pattern only at the first location or at the second location. Alternatively, the silicon wafer can be developed so that overlapping regions of the silicon wafer exposed by the pattern at the first location and the second location are relatively less soluble to photoresist developer than the non-overlapping regions of the silicon wafer exposed by the pattern only at the first location or at the second location.

In some embodiments, the angle of the tilting transparent medium can be continuously changed between 0.995 times and 1.005 times the first angle in a periodic manner.

An optical nanolithography system includes a light source capable of emitting light, a condenser lens capable of collimating light emitted by the light source, and a mask including a pattern through which light collimated by the condenser lens passes. The system also includes a tilting transparent medium through which light that passes through the mask passes, which is capable of being tilting about an axis and capable of changing the location of the pattern defined by the mask on a substrate. The system further includes a focusing lens capable of focusing the light passing through the tilting transparent medium, and an X-Y planar stage capable of holding the substrate on which the pattern of the mask is formed.

Details of one or more implementations and/or embodiments of the optical nanolithography system and method using a tilting transparent medium are set forth in the accompanying drawings and the description below. Other aspects

BRIEF DESCRIPTION OF DRAWINGS

FIG. 5a illustrates an example linear array pattern exposed at first location on a substrate, FIG. 5b illustrates the example linear array pattern exposed at second location on the substrate, FIG. 5c illustrates the example linear array pattern exposed at the first and second locations on the substrate, and FIG. 5d illustrates the substrate following development.

Like reference symbols indicate like elements throughout the specification and drawings.

DETAILED DESCRIPTION

A cost-effective optical nanolithography system and method using a tilting transparent medium that can modulate the transmission path of an exposure light beam and, thereby, change the location of exposure of a pattern on a substrate is disclosed. The tilting exposure lithography ("TEL") system is capable of creating features as small as 17% of the wavelength of the exposure light source onto various substrates, such as, for example, silicon wafers. The high-resolution patterning of the TEL system can be applied to large surface areas for fabrication of various integrated circuits and sensors. The TEL system can also be used as nanowriter capable of creating various patterns on substrates at high resolutions.

Figure 1:
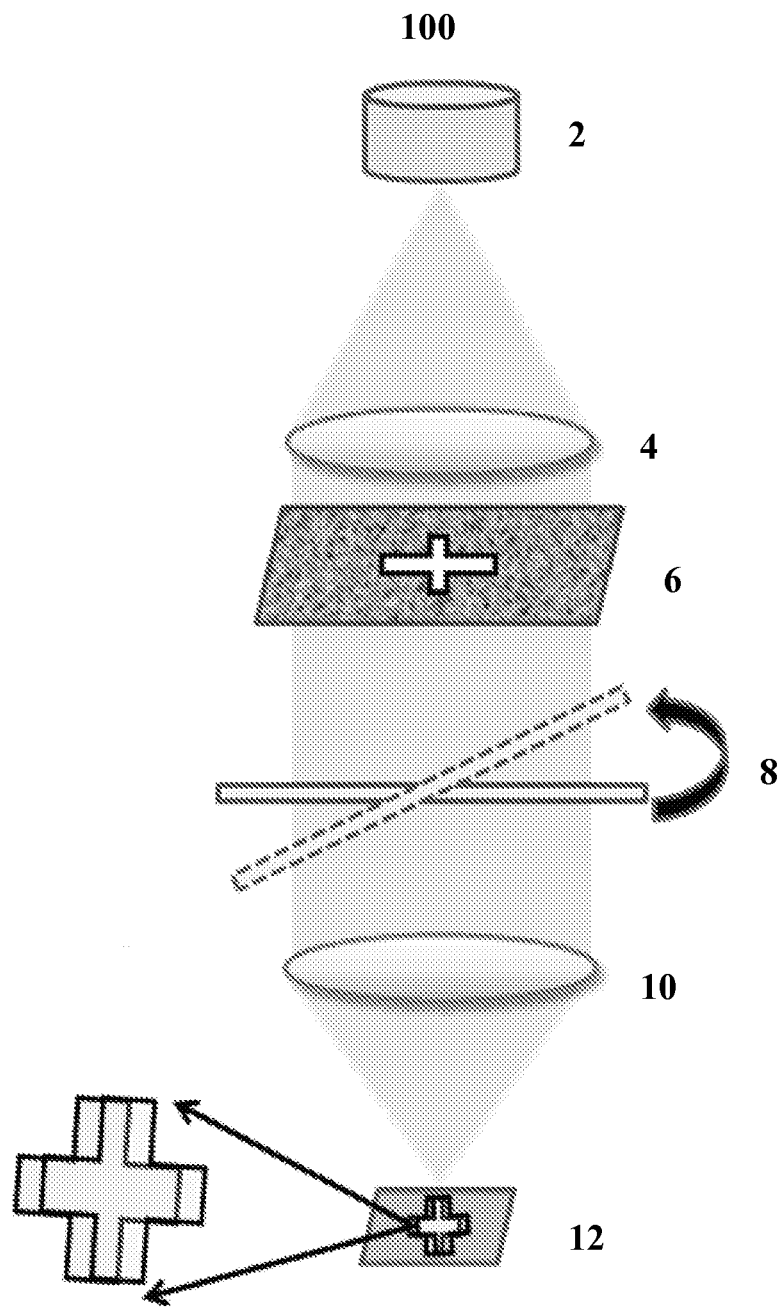
FIG. 1 illustrates an example tilting exposure lithography system.

Referring to FIG. 1, an example TEL system 100 is illustrated. The TEL system 100 can include a light source 2, such as, for example a gas-discharge lamp, an excimer laser, a semiconductor laser diode, and/or a light-emitting diode ("LED"). In some embodiments, the light source 2 can be a blue LED having a wavelength of about 470 nm, an ultraviolent LED having a wavelength of about 375 nm, or a semiconductor UV laser diode having a wavelength of about 405 nm. Light emitted from the light source 2 passes through a condenser lens 4, so that the emitted light is collimated onto the mask 6 (i.e., photomask).

The mask 6 includes a pattern to be formed onto the substrate 12. The pattern can be any pattern, such as, for example, an array of holes, an array of lines, a grid, and/or, a geometric pattern. As described in greater detail below, simultaneous tilting of the tilting transparent medium 8 and shifting of the substrate 12 can form serpentine features.

Light passing through the mask 6 then passes though a tilting transparent medium 8. The tilting transparent medium 8 can be made of any material, such as, for example, glass, plastic, a membrane of silicon dioxide ($SiO_2$), a membrane of silicon nitride ($Si_3N_4$), and/or any transparent high refractive index material. In some embodiments, the tilting transparent medium 8 can be tilted in any direction. For example, the tilting transparent medium 8 can be rotated about an axis in an X-Y plane. In some embodiments, the axis of rotation can, for example, intersect the center of mass of the tilting transparent medium 8 or, in other embodiments, be located outside of the tilting transparent medium 8.

The TEL system 100 also includes a focusing lens 10 that focuses the light passing through the tilting transparent medium 8 onto the substrate 12. The focusing lens 10 can be, for example, biconvex or plano-convex. The substrate 12 can be a wafer of any solid, such as a crystalline solid. The crystalline solid can be, for example, silicon crystal, germanium, gallium arsenide, and/or silicon carbide. The substrate 12 can be held on a fixed stage or a movable planar stage that is capable of moving in an X-Y plane.

The substrate 12 is coated with a photoresist material. The photoresist can be a positive resist in which the portion of the photoresist that is exposed to light becomes soluble to the photoresist developer and the unexposed portion remains insoluble, or a negative resist in which the portion of the photoresist that is exposed to light becomes insoluble to the photoresist developer and the unexposed portion remains soluble.

Rather than shifting or changing the mask 6 to achieve nanoscale lithography resolutions as in other prior art methods, the tilting transparent medium 8 of the TEL system 100 can be tilted to shift the exposed pattern on the substrate 12. In some embodiments, the tilting transparent medium 8 can be tilted in, for example, two or more discrete steps to shift the exposed pattern two or more times at different, but overlapping locations on the substrate 12. For example, as illustrated in FIG. 1, the cross pattern of the mask 6 has been exposed at two different locations on the substrate 12. The overlapping regions of the two exposures will be developed differently relative to the non-overlapping and unexposed regions and, as such, the resolution of the cross pattern will be increased.

In other embodiments, the tilting transparent medium 8 can be continuously, or gradually, tilted to shift the exposed pattern over a particular time period. The tilting of the tilting transparent medium 8 can be carried out in combination with movement of the substrate 12 in the X-Y plane in order to increase the capability of the TEL system to create more complex features.

Figure 2A:
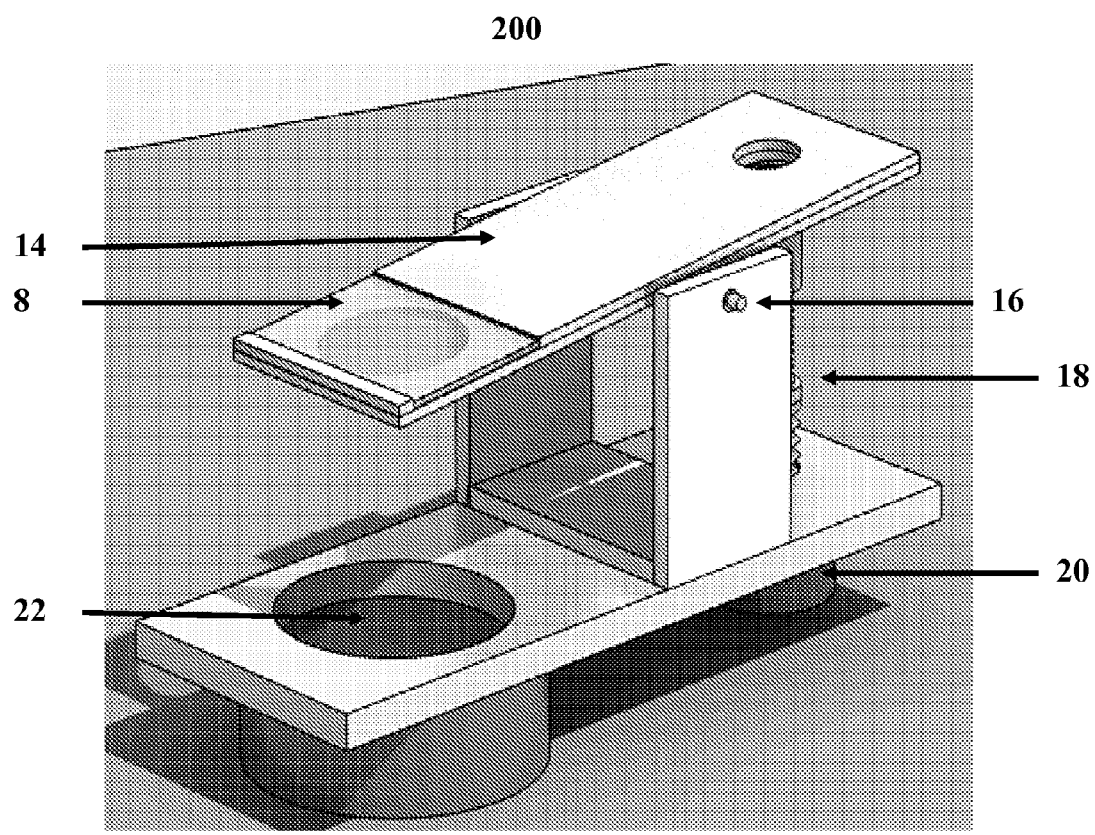
FIGS. 2a-b illustrate a front projection view and a rear view of a tilting transparent medium stage, respectively.
Figure 2B:
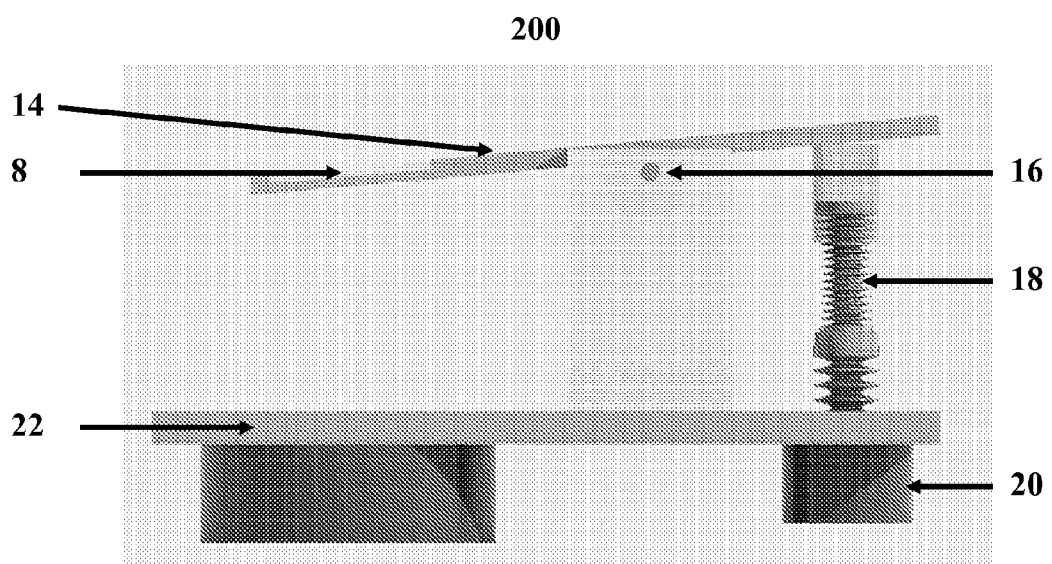

Referring to FIGS. 2a-b, a tilting transparent medium stage 200 holding the tilting transparent medium 8 is illustrated. FIG. 2a illustrates a front projection view and FIG. 2b illustrates a rear view of the tilting transparent medium stage 200, respectively. Light from the light source 2 (not illustrated) passes through the mask 6 (not illustrated) to the tilting transparent medium 8 held by the tilting transparent medium stage 200.

The tilting transparent medium stage 200 includes a tilting transparent medium holder 14, which holds the tilting transparent medium 8. In some embodiments, the tilting transparent medium holder 14 can be composed of a transparent medium, such as the transparent mediums described above in connection with the tilting transparent medium 8. As such, the tilting transparent medium 8 and the tilting transparent medium holder 14 can be integral and, therefore, no separate tilting transparent medium is necessary. The tilting transparent medium holder 14 can tilt the tilting transparent medium 8 about an axis 16.

To tilt the tilting transparent medium holder 14, a micrometer 18, i.e., z-translator, connected to the proximal end of the tilting transparent medium holder 14 can be modulated by hand, or by a direct current ("DC") and/or stepper motor 20. As the micrometer 18 is modulated in the z-axis, the proximal end of the tilting transparent medium holder 14 can either be lowered or raised, thereby tilting the distal end of the tilting transparent medium holder 14 and, thus, the tilting transparent medium 8.

By tilting the tilting transparent medium holder 14, the angle of the tilting transparent medium 8 about the axis 16 changes, thereby changing the angle though which light enters the tilting transparent medium 8 and the distance that the light beams travels through the tilting transparent medium 8. Therefore, the position at which the pattern of the mask 6 is exposed onto the substrate 12 also changes.

The aperture 22 is an opening through the bottom portion of the tilting transparent medium stage 200 that allows light passing through the tilting transparent medium 8 to pass to the focusing lens 10 (not illustrated).

Figure 3:
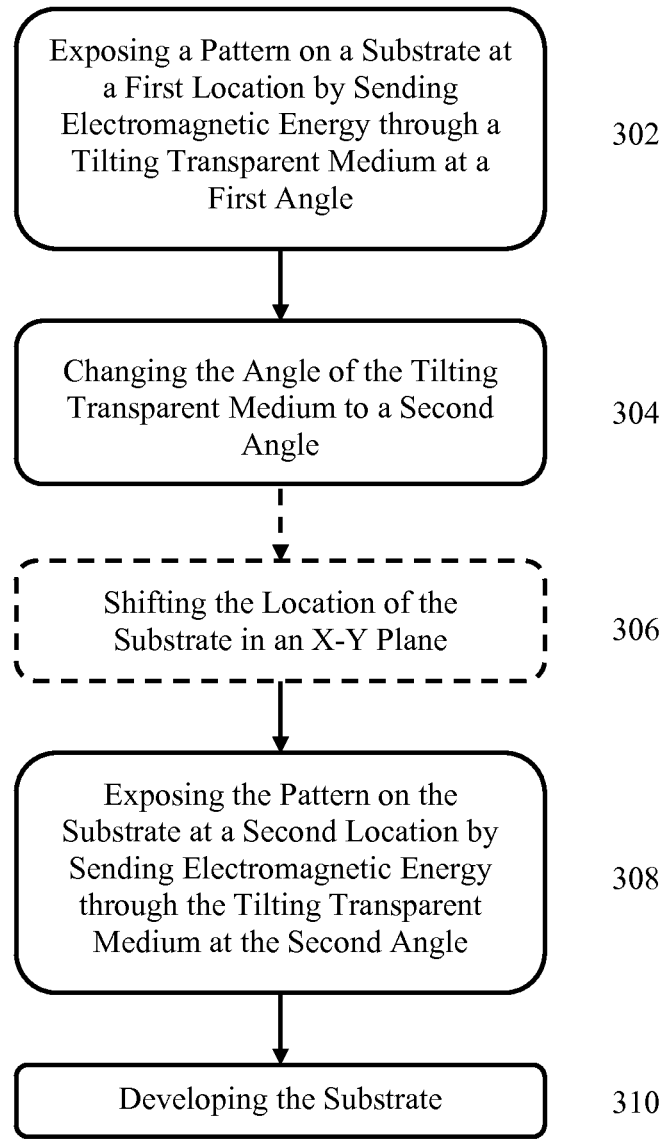
FIG. 3 illustrates an example method for optical nanolithography using a tilting transparent medium.

Referring to FIG. 3, an example method for optical nanolithography using a tilting transparent medium is illustrated. Initially, a pattern is exposed on a substrate at a first location by sending electromagnetic energy through a tilting transparent medium at a first angle (step 302). The pattern can be defined by the mask, such as the mask 6 of the TEL system 100. The pattern can be, for example, a linear array exposed at a first location on a substrate, as illustrated in FIG. 5a. The electromagnetic energy can be light illuminated from a light source, such as the light source 2 of the TEL system 100. The substrate, such as the substrate 12 of the TEL system 100, can be a silicon wafer.

Next, the angle of the tilting transparent medium is changed to a second angle that differs from the first angle (step 304). The tilting transparent medium can be the tilting transparent medium 8 of the TEL system 100 and is capable of being tilted to different angles to change the distance light travels through the tilting transparent medium 8. The tilting transparent medium 8 can be rotated about an axis, such as the axis 16, by modulating a micrometer connected to one end of a tilting transparent medium holder by hand and/or a by a motor.

Then, the location of the substrate in an X-Y plane can optionally be shifted (step 306). The location of the substrate can be changed by modulating a motorized X-Y stage holding the substrate. By changing the location of the substrate, more complex features, such as serpentine arrays, can be formed on the substrate without changing the mask.

Next, the pattern is exposed on the substrate at a second location by sending electromagnetic energy through the tilting transparent medium at the second angle (step 308). Because the distance through which the light beams passes through the tilting transparent medium changes, the pattern will be projected on the substrate at a second location that differs from the first location. However, the second location partially overlaps with the first location, such that portions of the substrate are exposed twice, i.e., doubly exposed. For example, referring to FIG. 5b, following at least the tilting of the transparent medium, the linear array pattern can be exposed at a second location. Thus, some regions of the linear array pattern at the first location and the second location overlap on the substrate, as illustrated in FIG. 5c.

Figure 4:
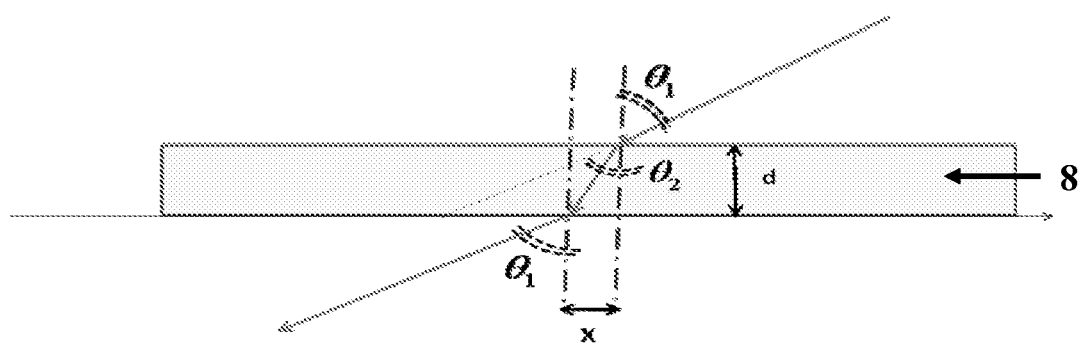
FIG. 4 illustrates the effect of light passing through an example tilting transparent medium.

The change in exposure location due to the change in angle of the tilting transparent medium can be generally described with reference to FIG. 4. As shown in FIG. 4, light enters and exits the tilting transparent medium 8 at the same angle $\theta_1$. However, because the refractive index of the tilting transparent medium 8 is different from that of the air through which the light beam passes to reach the tilting transparent medium 8, the path of the beam is shifted as the light exits the tilting transparent medium 8. The magnitude of the shift (x) depends on the thickness (d) of the tilting transparent medium 8, the incident angle ($\theta_1$) of the light beam, and the refractive index of the tilting transparent medium ($n_2$), and can be determined according to equation 1, below.

$$x = \frac{d \sin(\theta_1)}{\sqrt{n_2^2 - \sin(\theta_1^2)}} \quad (1)$$

Finally, the substrate is developed so that overlapping regions of the substrate exposed by the pattern at the first and second locations are developed differently from non-overlapping regions of the substrate exposed by the pattern only one location (step 310). For example, referring to FIG. 5, following development of the substrate, only the regions of the substrate that are exposed during steps 302 and 308 remain, such that the thickness of the lines of the linear array in FIG. 5d are thinner the thickness of the lines of the linear array in FIGS. 5a-b. As such, the feature resolution of the linear array is improved.

In some embodiments, depending on the development time, the unexposed regions of the substrate can be developed the same as or differently from the non-overlapping exposed regions of the substrate. For example, if the development time is relatively long, the unexposed regions of the substrate will be developed the same as the non-overlapping exposed regions, whereas, if the development time is relatively short, the unexposed regions of the substrate will be developed differently from the non-overlapping exposed regions.

Although the example method for optical nanolithography using a tilting transparent medium illustrated in FIG. 3 includes two exposing steps, three or more exposing steps can be performed in the method. Each exposure of the pattern can be performed with the tilting transparent medium being at a different angle and/or the substrate being at a different location. The number of exposure steps may depend on, for example, the desired feature resolution, the complexity of the features, and/or user preference. A higher feature resolution can require a greater number of exposure steps.

Example 1

Figure 6A:
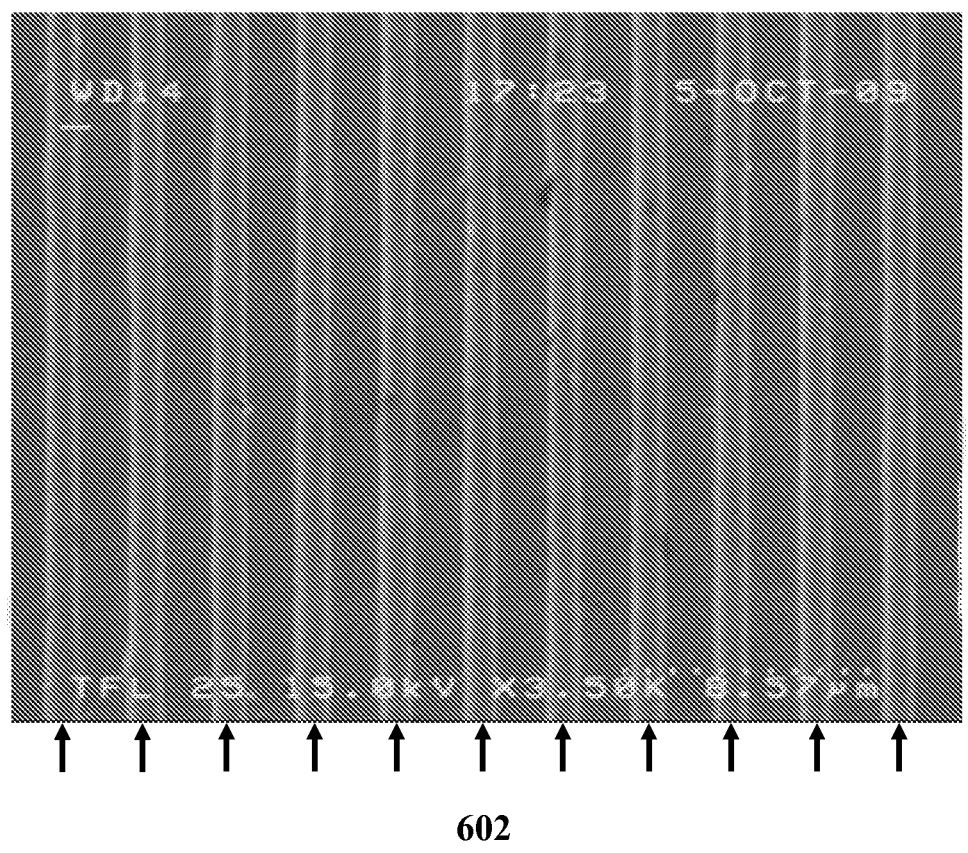
FIG. 6a illustrates a scanning electron microscopy ("SEM") image of a developed silicon wafer following a single exposure according to EXAMPLE 1.

A silicon wafer coated with a photoresist having an optimal thickness of about 1000 nm was used as a substrate. The silicon wafer was soft baked in an oven at 70° C. for approximately five minutes. A linear array pattern defined by a mask was then exposed onto the silicon wafer with a glass tilting transparent medium having a thickness of 1 mm at a first angle using a blue LED light source. Following the first exposure step, to determine the lithography resolution before tilting of the tilting transparent medium, the silicon wafer was baked at 120° C. for approximately three minutes and then developed. A scanning electron microscopy ("SEM") image of the developed silicon wafer at a magnification of 3,500 times illustrated in FIG. 6a shows that the lines indicated by the arrows 602 have a width of about 1.2 μm.

Figure 6B:
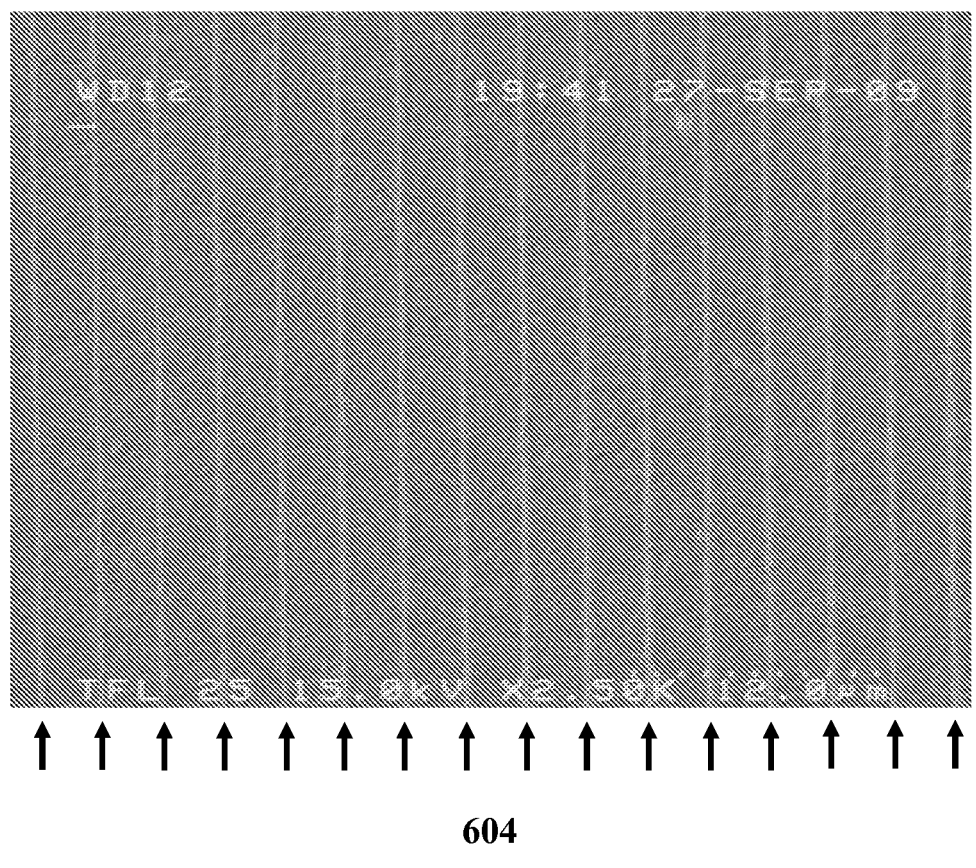
FIG. 6b illustrates an SEM image of a developed silicon wafer following two exposures according to EXAMPLE 1.

Another silicon wafer was prepared according to the same procedure described above. The same linear array pattern was exposed onto the silicon wafer with the tilting angle at the same first angle, corresponding to step 302. Next, the angle of the tilting transparent medium was changed, corresponding to step 304. The linear array pattern was again exposed onto the silicon wafer, such that the change in angle resulted in the linear array pattern being exposed with a 700 nm shift in the x-axis relative to the first exposure, corresponding to step 308. The silicon wafer was then developed, corresponding to step 310. An SEM image of the developed silicon wafer following the two exposures at a magnification of 2,500 times is illustrated in FIG. 6b. FIG. 6b shows that the lines indicated by the arrows 604 now have a width of 500 nm. As such, the tilting method of this application increased the resolution of the linear array pattern on the silicon wafer over twofold.

Example 2

Figure 7A:
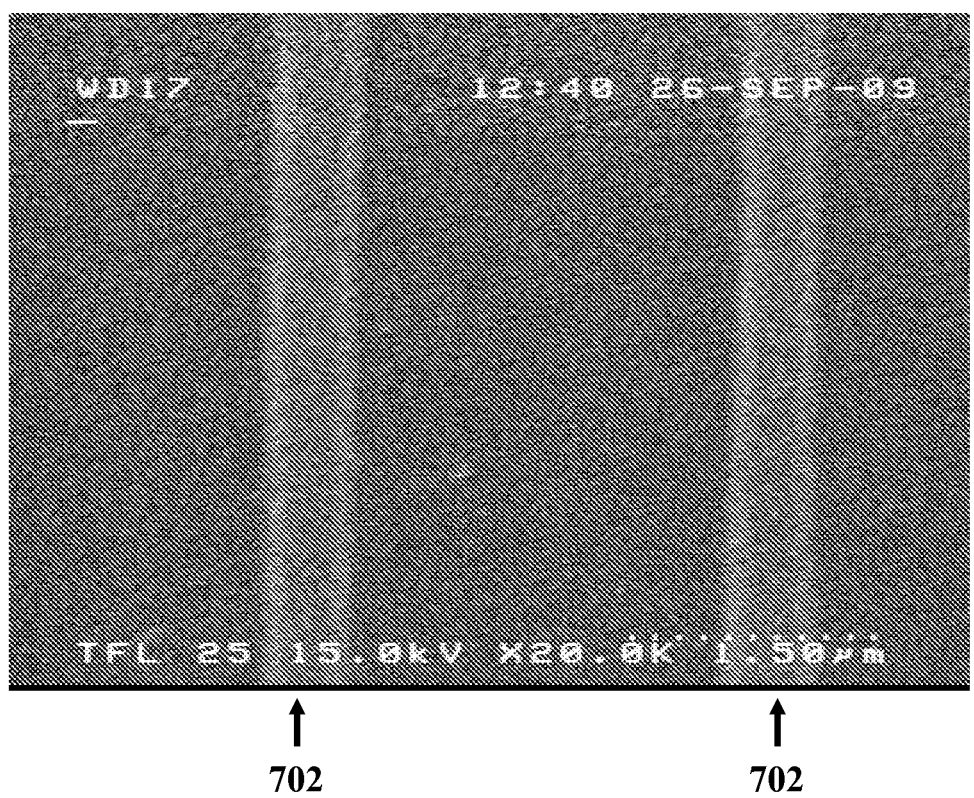
FIG. 7a illustrates an SEM image of a developed silicon wafer following a single exposure according to EXAMPLE 2.

A silicon wafer was prepared according to the procedure described in EXAMPLE 1. A narrower linear array pattern defined by a mask was then exposed onto the silicon wafer with the tilting transparent medium at a first angle using a blue LED light source. The silicon wafer was baked at 120° C. for approximately three minutes and then developed. An SEM image of the developed silicon wafer following a single exposure at a magnification of 20,000 times illustrated in FIG. 7a shows that the lines 702 have a width of 500 nm.

Another silicon wafer was prepared according to the same procedure described above. The same linear array pattern was exposed onto the silicon wafer with the tilting angle at the same first angle, corresponding to step 302. Next, the angle of the tilting transparent medium was changed, corresponding to step 304. The linear array pattern was again exposed onto the silicon wafer, such that the change in angle of the tilting transparent medium resulted in the linear array pattern being exposed with a 400 nm shift in the x-axis relative to the first exposure, corresponding to step 308. The silicon wafer was then developed, corresponding to step 310.

Figure 7B:
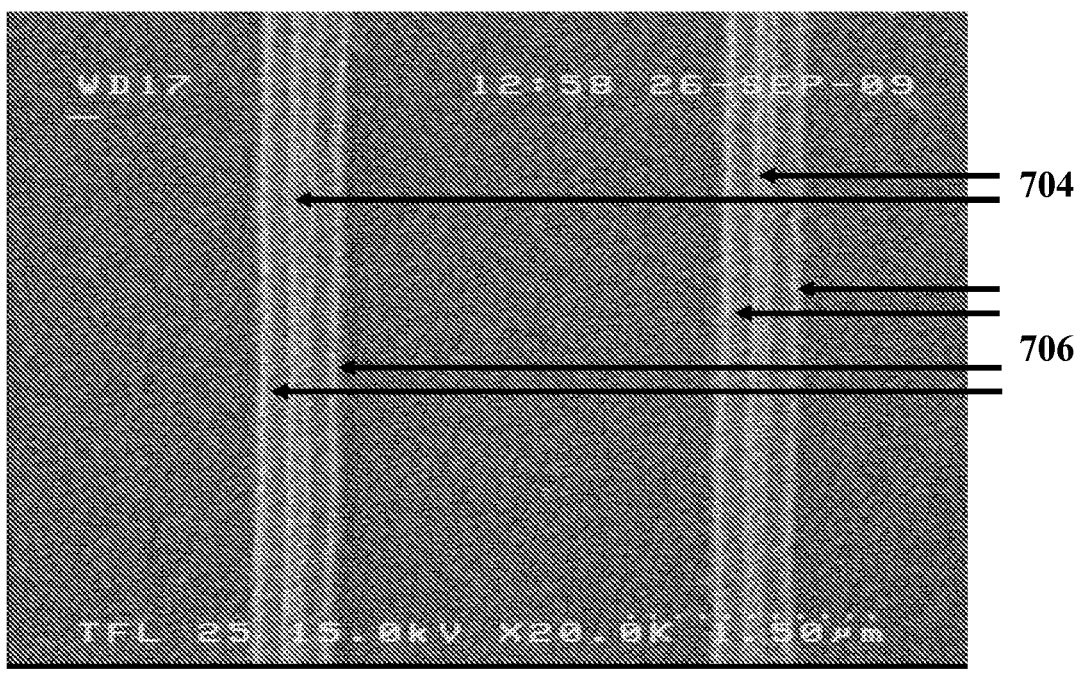
FIG. 7b illustrates an SEM image of a partially developed silicon wafer following two exposures according to EXAMPLE 2.

An SEM image of the developed silicon wafer with a relatively short exposure time at a magnification of 20,000 times is illustrated in FIG. 7b. FIG. 7b shows that the lines indicated by the arrows 704, corresponding to the overlapping regions of the silicon wafer exposed at the first position and second position, have a width of 100 nm. The lines indicated by the arrows 706, corresponding to the non-overlapping exposed regions, have a width of 400 nm.

Figure 7C:
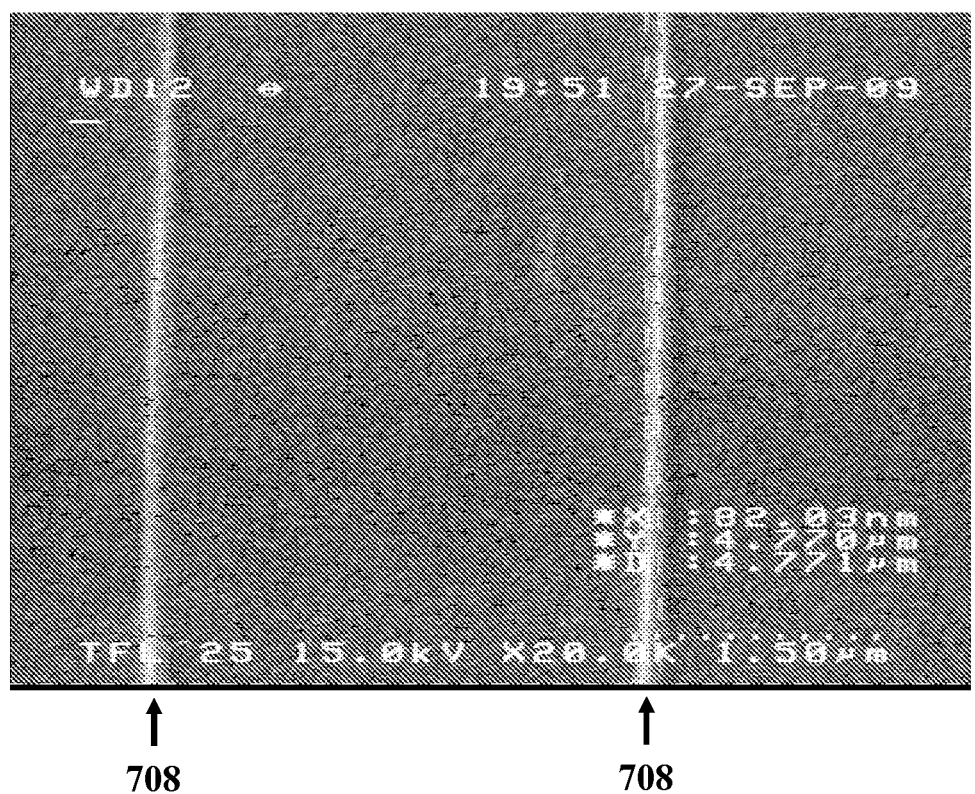
FIG. 7c illustrates an SEM image of a fully developed silicon wafer following two exposures according to EXAMPLE 2.

An SEM image of the same silicon wafer with a relatively long exposure time at a magnification of 20,000 times is illustrated in FIG. 7c. FIG. 7c shows that the lines indicated by the arrows 708, corresponding to the overlapping regions of the silicon wafer 704 of FIG. 7b, only remain after a relatively long exposure time. As illustrated in FIG. 7c, the lines 708 have a width of about 100 nm. As such, the tilting method of this application increased the resolution of the linear array pattern on the silicon wafer about fivefold.

Example 3

A nanolithography system using a tilting transparent medium can also be used as a nanowriter. In particular, if the mask defines, for example, one or an array of holes, complex patterns can be formed on a substrate by tilting the tilting transparent medium and/or displacing the substrate in the X-Y plane.

The tilting transparent medium can be tilted in two different modes. First, coarse tilting can be performed to substantially shift the position that a light beam passing through a hole defined by the mask is exposed on the substrate. In some embodiments, the position of the light beam following coarse tilting can be shifted such that the position of the light beam does not overlap with any portion of the light beam before coarse tilting. The coarse tilting can result from rotating the tilting transparent medium up to 45° about an axis of rotation and, preferably, rotating the tilting transparent medium up to 10° about an axis of rotation. The angle of the tilting transparent medium can be continuously changed between an original angle and a changed angle to form a repeating pattern on a substrate, such as a serpentine pattern.

Second, fine tilting can be performed to increase the feature resolution of an integrated circuit, i.e., to reduce the thickness of the features formed on a substrate. The fine tilting can result from a continuous change in a periodic manner, i.e., jitter, of up to −0.995 times to 1.005 times an angle of the tilting transparent medium. For example, if the angle of the tilting transparent medium is 25°, the fine tilting can result in the angle being continuously changed between 24.875° and 25.125° in a periodic manner.

Figure 8:
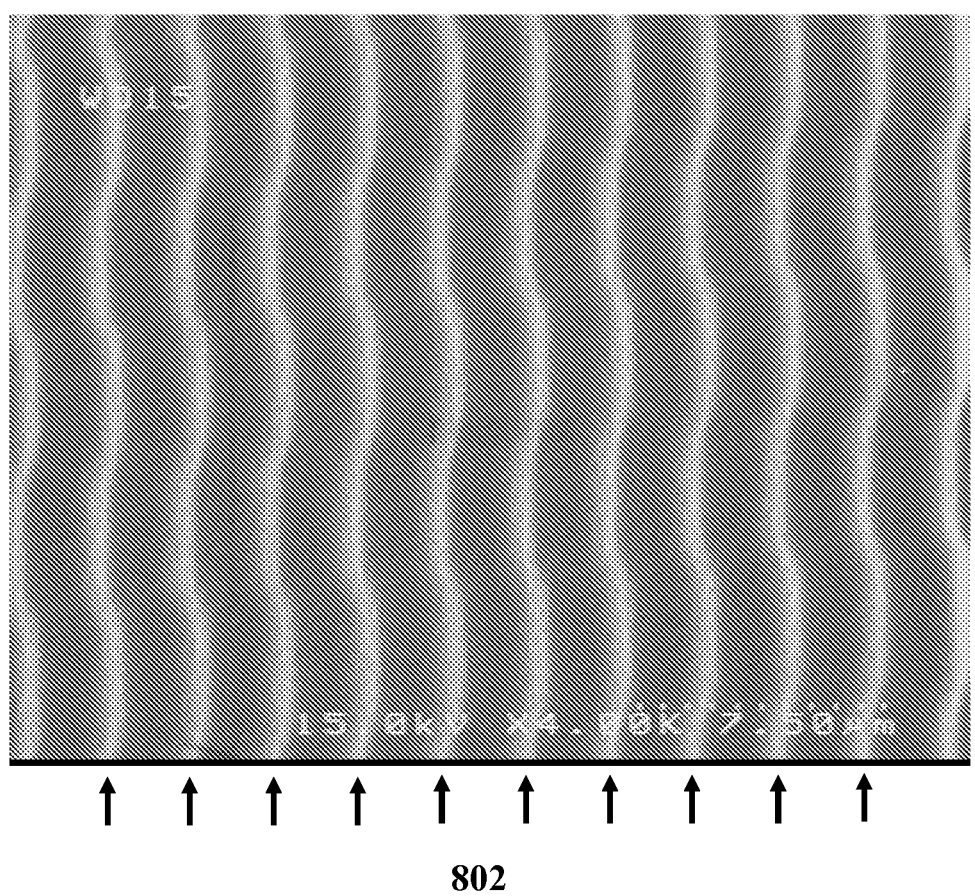
FIG. 8 illustrates an SEM image of a developed substrate showing serpentine features according to EXAMPLE 3.

Referring to FIG. 8, an SEM image of a developed substrate shows several serpentine features 802 formed on the substrate. The serpentine features 802 are formed only by shifting the substrate in an X-Y plane without changing the angle of the tilting transparent medium. The width of the serpentine features 802 is 1000 nm.

Figure 9:
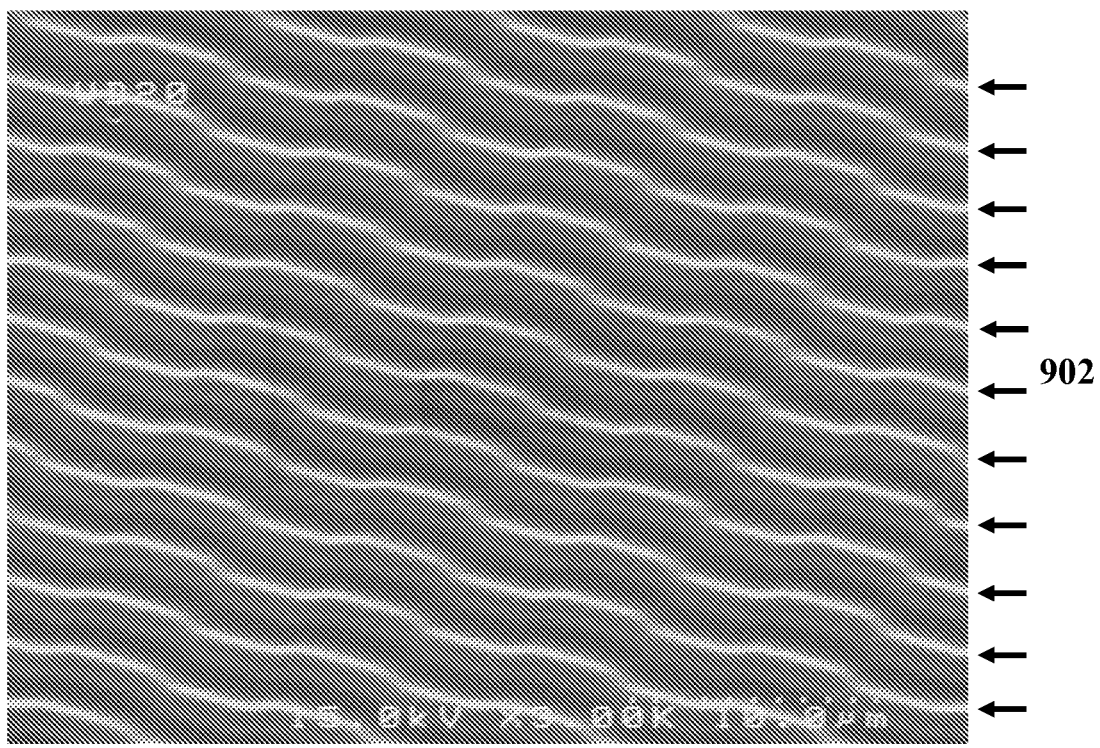
FIG. 9 illustrates an SEM image of another developed substrate showing higher resolution serpentine features according to EXAMPLE 3.

Referring to FIG. 9, an SEM image of another developed substrate using the same mask used to form serpentine features 802 shows several serpentine features 902 formed on the substrate. The serpentine features 902 are formed by both tilting the tilting transparent medium and shifting the substrate in an X-Y plane. As a result of the tilting, the light beam was shifted 600 nm on the substrate, resulting in the width of the serpentine features 902 being 400 nm. Thus, by tilting the tilting transparent medium, the resolution of the serpentine features 902 was improved over twofold.

It is to be understood the implementations are not limited to the particular processes, devices, and/or apparatus described which may, of course, vary. It is also to be understood that the terminology used herein is for the purpose of describing particular embodiments only, and is not intended to be limiting. As used in this application, the singular forms "a", "an" and "the" include plural referents unless the content clearly indicates otherwise.

Reference in the specification to "one embodiment" or "an embodiment" means that a particular feature, structure, characteristic, or function described in connection with the embodiment is included in at least one embodiment herein. The appearances of the phrase "in some embodiments" in the specification do not necessarily all refer to the same embodiment.

Accordingly, other embodiments and/or implementations are within the scope of this application.

What is claimed is:

1. A method for optical nanolithography, comprising:
    exposing a pattern on a substrate at a first location by sending electromagnetic energy through a tilting transparent medium at a first angle relative to the axis of projection of the electromagnetic energy;
    changing the angle of the tilting transparent medium to a second angle relative to the axis of projection of the electromagnetic energy, the second angle being different from the first angle;
    exposing the pattern on the substrate at a second location by sending electromagnetic energy through the tilting transparent medium at the second angle, the second location being different from the first location, and the second location partially overlapping with the first location; and developing the substrate so that overlapping regions of the substrate exposed by the pattern at the first location and at the second location are developed differently from non-overlapping regions of the substrate exposed by the pattern only at the first location or at the second location.

2. The method of claim 1, further comprising:

shifting the location of the substrate in an X-Y plane, wherein exposing the pattern on the substrate at the second location by sending electromagnetic energy through the tilting transparent medium at the second angle comprises exposing the pattern on the shifted substrate at the second location by sending electromagnetic energy through the tilting transparent medium at the second angle.

3. The method of claim 1, wherein exposing the pattern on the substrate at the first location by sending the electromagnetic energy through the tilting transparent medium at the first angle comprises exposing the pattern on the substrate at the first location by sending the electromagnetic energy through a mask defining the pattern and then through the tilting transparent medium at the first angle.

4. The method of claim 1, wherein the electromagnetic energy is light.

5. The method of claim 4, wherein:

exposing the pattern on the substrate at the first location by sending the electromagnetic energy through the tilting transparent medium at the first angle comprises exposing the pattern on the substrate at the first location by sending light emitted from a light-emitting diode through the tilting transparent medium at the first angle, and exposing the pattern on the substrate at the second location by sending the electromagnetic energy through the tilting transparent medium at the second angle comprises exposing the pattern on the substrate at the second location by sending the light emitted from the light-emitting diode through the tilting transparent medium at the second angle.

6. The method of claim 4, wherein:

exposing the pattern on the substrate at the first location by sending the electromagnetic energy through the tilting transparent medium at the first angle comprises exposing the pattern on the substrate at the first location by sending light emitted from a semiconductor laser diode through the tilting transparent medium at the first angle, and exposing the pattern on the substrate at the second location by sending the electromagnetic energy through the tilting transparent medium at the second angle comprises exposing the pattern on the substrate at the second location by sending the light emitted from the semiconductor laser diode through the tilting transparent medium at the second angle.

7. The method of claim 1, wherein the pattern is a geometric pattern.

8. The method of claim 1, wherein the pattern is a linear array of holes.

9. The method of claim 1, wherein changing the angle of the tilting transparent medium to the second angle comprising vertically displacing one end of a tilting transparent medium holder.

10. The method of claim 9, wherein vertically displacing one end of the tilting transparent medium holder comprises modulating a micrometer connected to the one end of the tilting transparent medium holder.

11. The method of claim 10, wherein modulating the micrometer connected to the one end of the tilting transparent medium holder comprises modulating the micrometer connected to the one end of the tilting transparent medium holder by a motor.

12. The method of claim 1, wherein changing the angle of the tilting transparent medium to the second angle comprises rotating the tilting transparent medium about an axis of rotation.

13. The method of claim 1, wherein the substrate is a silicon wafer coated with a photoresist.

14. The method of claim 13, wherein developing the substrate so that the overlapping regions of the substrate exposed by the pattern at the first location and at the second location are developed differently from the non-overlapping regions of the substrate exposed by the pattern only at the first location or at the second location comprises developing the silicon wafer so that overlapping regions of the silicon wafer exposed by the pattern at the first location and the second location are relatively more soluble to photoresist developer than the non-overlapping regions of the silicon wafer exposed by the pattern only at the first location or at the second location.

15. The method of claim 13, wherein developing the substrate so that the overlapping regions of the substrate exposed by the pattern at the first location and at the second location are developed differently from the non-overlapping regions of the substrate exposed by the pattern only at the first location or at the second location comprises developing the silicon wafer so that overlapping regions of the silicon wafer exposed by the pattern at the first location and the second location are relatively less soluble to photoresist developer than the non-overlapping regions of the silicon wafer exposed by the pattern only at the first location or at the second location.

16. The method of claim 1, wherein exposing the pattern on the substrate at the first location by sending electromagnetic energy through the tilting transparent medium at the first angle comprises continuously changing the angle of the tilting transparent medium between 0.995 times and 1.005 times the first angle in a periodic manner.

* * * * *